(12) United States Patent
Del Puerto et al.

(10) Patent No.: US 9,229,341 B2
(45) Date of Patent: Jan. 5, 2016

(54) RETICLE SUPPORT THAT REDUCES RETICLE SLIPPAGE

(75) Inventors: Santiago E. Del Puerto, Milton, NY (US); Enrico Zordan, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 1013 days.

(21) Appl. No.: 12/627,771

(22) Filed: Nov. 30, 2009

(65) Prior Publication Data

US 2010/0195081 A1 Aug. 5, 2010

Related U.S. Application Data

(60) Provisional application No. 61/150,211, filed on Feb. 5, 2009.

(51) Int. Cl.
*G03F 7/20* (2006.01)
(52) U.S. Cl.
CPC ............ *G03F 7/70825* (2013.01); *G03F 7/707* (2013.01); *G03F 7/70716* (2013.01); *G03F 7/70758* (2013.01); *G03F 7/70783* (2013.01)
(58) Field of Classification Search
CPC ....................................................... G03F 7/707
USPC .................................. 355/75, 72–74, 76, 53
See application file for complete search history.

(56) References Cited

U.S. PATENT DOCUMENTS

| | | | |
|---|---|---|---|
| 6,172,738 B1 | 1/2001 | Korenaga et al. | |
| 6,469,773 B1 | 10/2002 | Iwamoto | |
| 7,236,233 B2 | 6/2007 | Heerens et al. | |
| 7,333,180 B2 | 2/2008 | Tanaka | |
| 7,459,701 B2 | 12/2008 | Baggen et al. | |
| 7,667,822 B2 | 2/2010 | Jacobs et al. | |

(Continued)

FOREIGN PATENT DOCUMENTS

| | | |
|---|---|---|
| JP | 06-020917 A | 1/1994 |
| JP | 10-149976 A | 6/1998 |
| JP | 10-149979 A | 6/1998 |

(Continued)

OTHER PUBLICATIONS

English-Language Translation of Notification of Reason(s) for Refusal directed to related Korean Patent Application No. 10-2010-0010509, dated Jun. 29, 2011, Korean Intellectual Property Office; 3 pages.

(Continued)

*Primary Examiner* — Chia-How Michael Liu
(74) *Attorney, Agent, or Firm* — Sterne, Kessler, Goldstein & Fox P.L.L.C.

(57) ABSTRACT

A system and method substantially eliminate reticle slip during the movement of a reticle stage. The system includes a mask holding system, a mask force device, and a support transport device. The mask holding system includes a support device and a holding device where the holding device releasably couples a mask, e.g., a patterning device such as a reticle having a pattern, to the support device. The mask force device is releasably connected to the mask in order to provide an accelerating force to the mask, such that a projection optic in a lithographic apparatus may accurately project a pattern imparted by the patterning device onto a target portion of the substrate by using a radiation beam. The support transport device is coupled to and moves the mask support device concurrently with the mask force device.

19 Claims, 10 Drawing Sheets

(56) References Cited

U.S. PATENT DOCUMENTS 7,742,149 B2   6/2010   De Vos et al.
7,956,982 B2   6/2011   Hol et al.

FOREIGN PATENT DOCUMENTS

| | | |
|---|---|---|
| JP | 11-162809 A | 6/1999 |
| JP | 11-226823 A | 8/1999 |
| JP | 2002-343850 A | 11/2002 |
| JP | 2005-251788 A | 9/2005 |
| JP | 2006-352115 A | 12/2006 |
| JP | 2007-221124 A | 8/2007 |
| JP | 2007-266187 A | 10/2007 |
| JP | 2008-300828 A | 12/2008 |
| KR | 2005-0040115 A | 5/2005 |
| TW | 405161 B | 9/2000 |
| TW | 200727094 A | 7/2007 |
| WO | WO 2008/087725 A1 | 7/2008 |

OTHER PUBLICATIONS

English-Language Translation of Notice of Reasons for Rejection directed to related Japanese Patent Application No. 2010-017631, mailed Jan. 26, 2012, from the Japanese Patent Office; 4 pages.

RETICLE SUPPORT THAT REDUCES RETICLE SLIPPAGE

CROSS REFERENCE TO RELATED APPLICATIONS

This application claims the benefit under 35 U.S.C. §119 (e) to U.S. Provisional Patent Application No. 61/150,211, filed Feb. 5, 2009, which is incorporated by reference herein in its entirety.

FIELD

The present invention generally relates to lithography, and more particularly to reticle supports.

BACKGROUND

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device, which is alternatively referred to as a mask or a reticle, is typically used to generate a circuit pattern to be formed on an individual layer in an IC. This pattern is transferred onto the target portion (e.g., comprising part of, one, or several dies) on the substrate (e.g., a silicon wafer). Transfer of the pattern is typically via imaging onto a layer of radiation-sensitive material (e.g., resist) provided on the substrate. In general, a single substrate contains a network of adjacent target portions that are successively patterned.

Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

To increase production rate of scanned patterns, a patterning device, e.g., a mask or reticle, is scanned at constant velocity, for example 3 meters/second across a projection lens, back and forth along a scan direction. Therefore, starting from rest, the reticle quickly accelerates to reach the scan velocity, then at the end of the scan, it quickly decelerates to zero, reverses direction and accelerates in the opposite direction to reach the scan velocity. The acceleration/deceleration rate is, for example, 15 times the acceleration of gravity. There is no inertial force on the reticle during the constant velocity portion of the scan. However, the large inertial force encountered during the acceleration and deceleration portions of the scan, for example 60 Newtons (=0.4 kg of reticle mass×150 m/sec2 of acceleration) can lead to slippage of the reticle. Such slippage can result in a misaligned device pattern on a substrate. Attempts to solve misalignment include using a clamp to hold the reticle in place and/or using a friction coating to increase friction between the reticle and the clamp. Ever increasing production rates demand ever faster direction reversals, and therefore higher accelerations have reduced the benefits of these solutions.

Other attempts to solve reticle slippage include devices that are mounted on a chuck of a reticle stage to exert a force between the reticle and the chuck equal in magnitude and opposite in direction to the inertial force experienced by the reticle during the acceleration portion of the motion of the stage. External power or inertial masses and levers are used to produce the force.

Externally powered anti-slip devices dissipate power near the reticle so they can cause thermal stability problems. Also, wires can dynamically couple the chuck to a moving frame, which is undesirable for vibration isolation. Separate control requires extra electronic hardware and software.

Inertial anti-slip devices can add substantial mass to the chuck, which is undesirable for high acceleration. Inertial anti-slip devices can further complicate the dynamics of the chuck by adding low eigenmodes that require additional filtering of an input motion command signal.

SUMMARY

Given the foregoing, improved methods and systems are needed that provide an anti-slip solution for patterning devices that can function under high acceleration with minimal additional mass or controls.

An embodiment of the present invention provides a system comprising a mask holding system including of a support device and a holding device, where the holding device releasably couples a mask to the support device. A mask force device is configured to provide an accelerating force to the mask, wherein the transport device is releasably coupled to the mask. In addition, a support transport device is configured to move the support device.

Another embodiment of the present invention provides a stage system for a lithographic apparatus including of a stage, a mask releasably coupled to the stage, a stage control system configured to control a movement of the stage, and a mask control system configured to control a force applied to the mask. A common control signal controls the stage control system and the mask control system.

A further embodiment of the present invention provides a lithographic apparatus stage control method that includes of supporting a mask with a support device while concurrently supporting the pattern mask using a vacuum device. The method continues by moving the support device using a first moving device and applying a force to the mask using a second moving device.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Embodiments of the present invention are directed to a reticle transport with anti-slip control. This specification discloses one or more embodiments that incorporate the features of the present invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the present invention may be implemented in hardware, firmware, software, or any combination thereof. Embodiments of the present invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include the following: read-only memory (ROM); random access memory (RAM); magnetic disk storage media; optical storage media; and, flash memory devices. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1A:
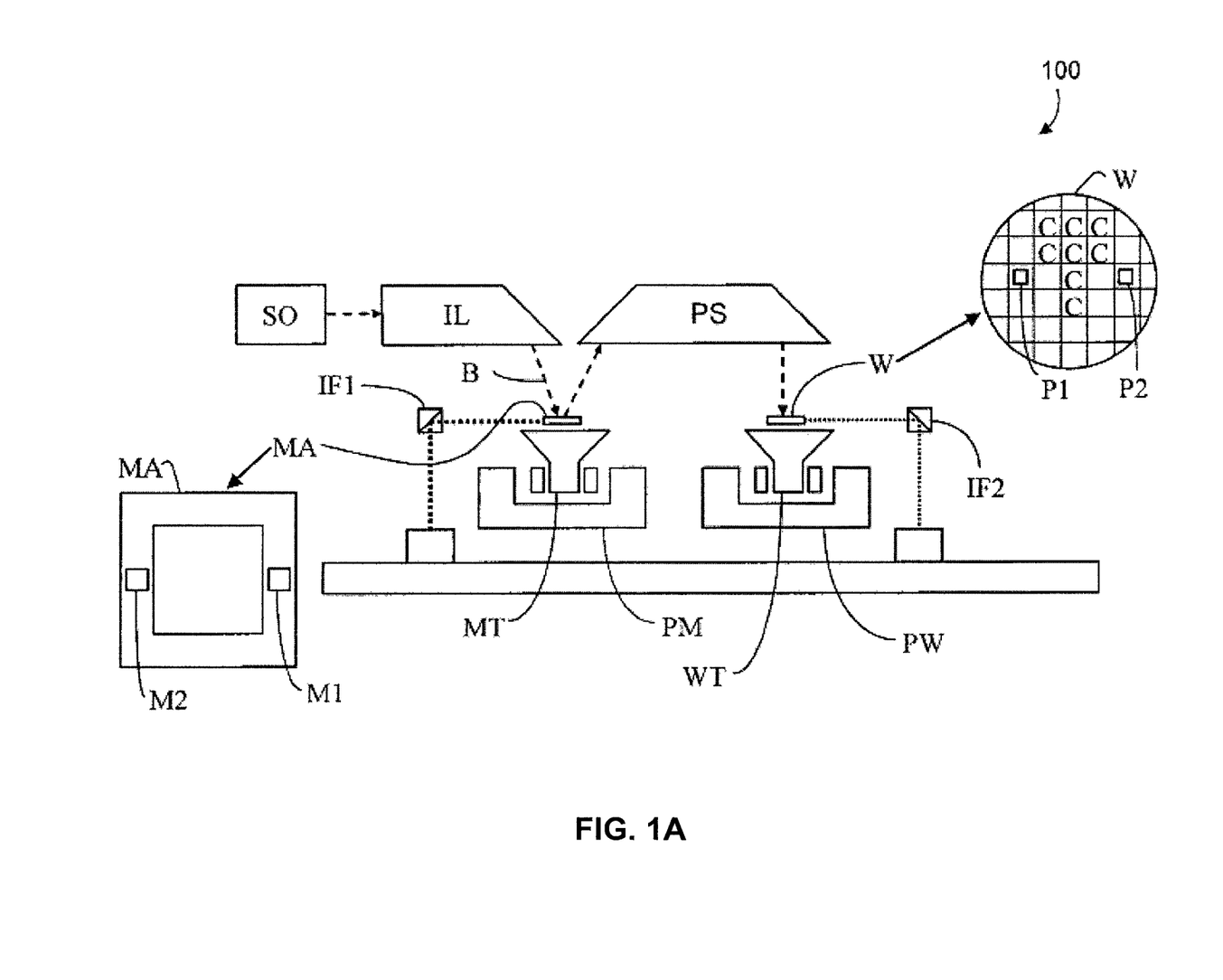
FIG. 1A is an illustration of a reflective lithographic apparatus, according to an embodiment of the present invention.
Figure 1B:
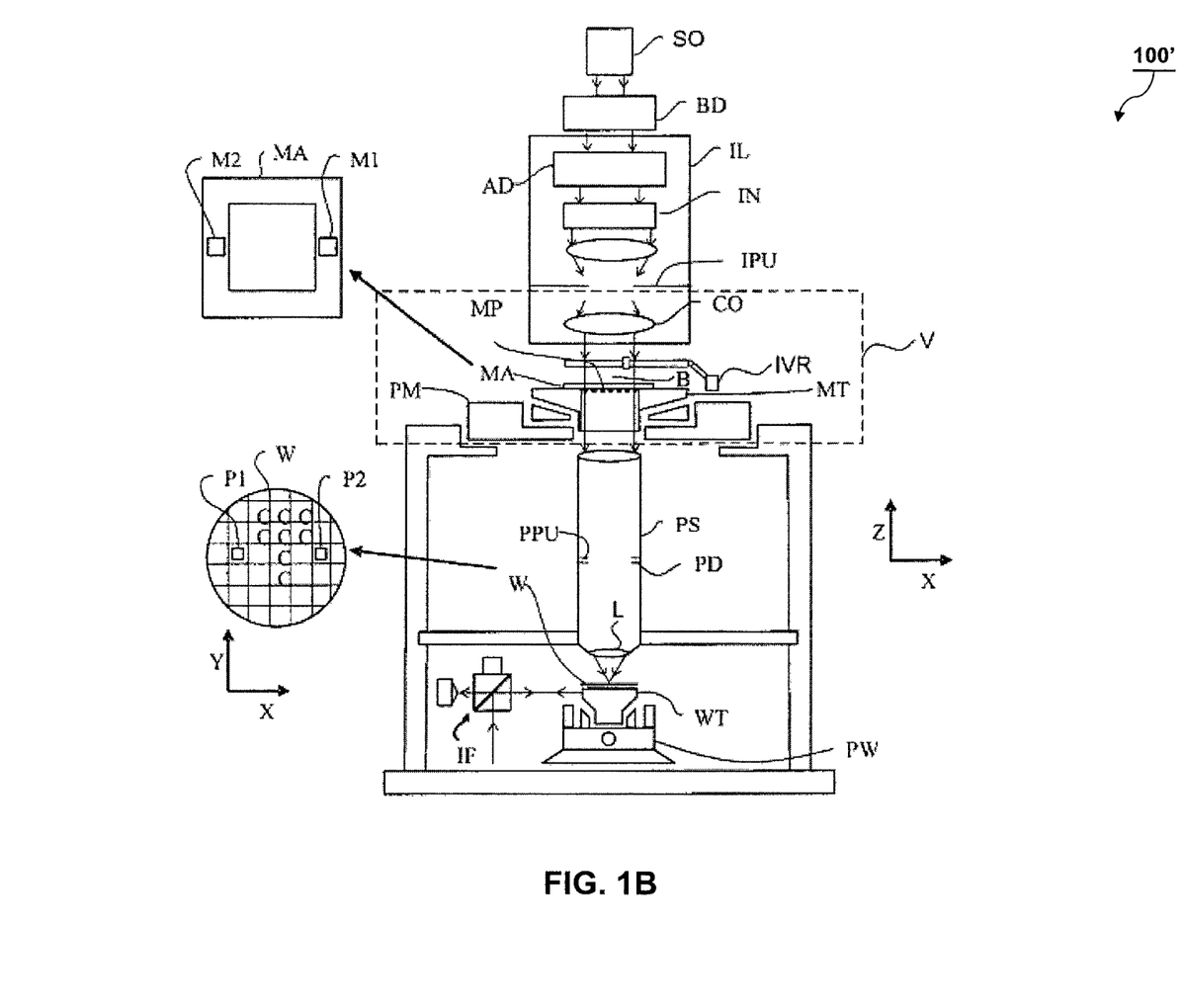
FIG. 1B is an illustration of a transmissive lithographic apparatus, according to an embodiment of the present invention.

FIG. 1 is an illustration of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and, a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, magnetic, electromagnetic, electrostatic, or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. The support structure MT can ensure that the patterning device is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables (and/or two or more mask tables) WT. In such "multiple stage" machines, the additional substrate tables WT can be used in parallel, or preparatory steps can be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder, or capacitive sensor), the substrate table WT can be moved accurately (e.g., so as to position different target portions C in the path of the radiation beam B). Similarly, the first positioner PM and another position sensor IF1 can be used to accurately position the patterning device (e.g., mask) MA with respect to the path of the radiation beam B. Patterning device (e.g., mask) MA and substrate W can be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, or capacitive sensor), the substrate table WT can be moved accurately (e.g., so as to position different target portions C in the path of the radiation beam B). Similarly, the first positioner PM and another position sensor (not shown in FIG. 1B) can be used to accurately position the mask MA with respect to the path of the radiation beam B (e.g., after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner) the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

The lithographic apparatuses 100 and 100' can be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT can be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to mask-less lithography that utilizes a programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (e.g., having a wavelength λ of 365, 248, 193, 157 or 126 nm), extreme ultraviolet (EUV or soft X-ray) radiation (e.g., having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

Figure 2:
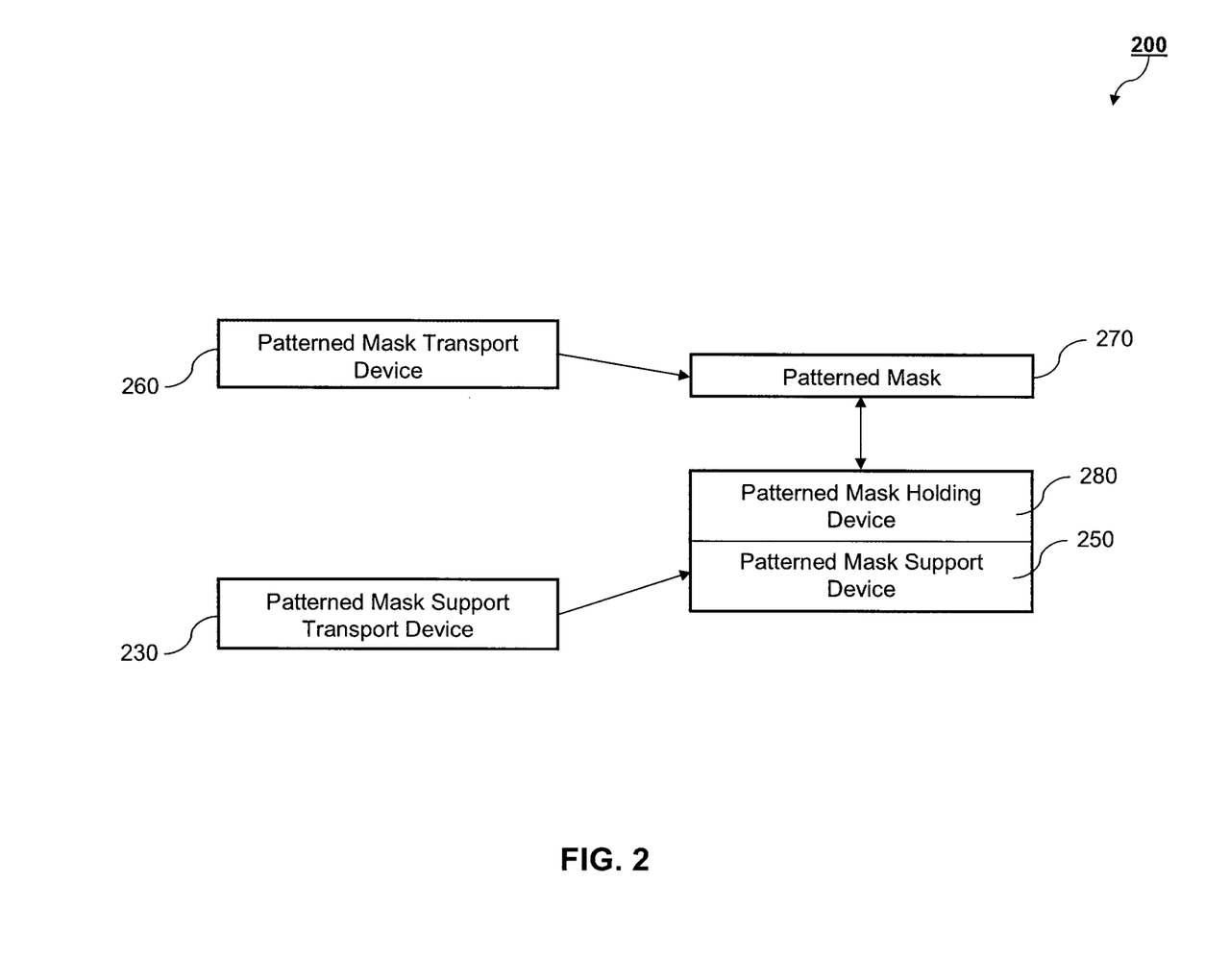
FIG. 2 is an illustration of a reticle transport system with anti-slip control, according to an embodiment of the present invention.

FIG. 2 is an illustration of a reticle transport system 200, according to an embodiment of the invention.

In this example, reticle transport system 200 includes a transport device 230, a support 250, a patterning device 270, a mask force device 260, and a holding device 280. Transport device 230 transports support 250. Support 250 supports a patterning device 270. Mask force device 260 applies an accelerating force to patterning device 270 during an accelerating portion of a scanning motion profile. Holding device 280 holds patterning device 270, such that during a constant velocity portion of a scanning motion profile there is no displacement of the patterned mask relative to the mask support transport device.

In one example, patterning device 270 (e.g., a mask or reticle) is releasably held to support 250 by holding device 280 (e.g., that uses a vacuum). Support device 250 can be configured to move in both an x-direction and a y-direction. Transport device 230 can be coupled to support device 250, such that transport device 230 provides sufficient force to accelerate support device 250 during an acceleration portion of a scanning motion profile.

In one example, transport device 230 may move support device 250, and the releasably held mask 270, at a high rate of speed and acceleration. High acceleration can generate a shearing force between mask 270 and support device 250. The shearing force can cause slippage of mask 270, relative to holding device 280. To substantially eliminate the shearing force, mask force device 260 may be releasably coupled to mask 270. Mask force device 260 can provide a sufficient force directly on mask 270 to reduce the shearing force between mask 270 and support device 250. Given the coupling of mask force device 260 to mask 270, holding device 280 can provide a sufficient holding force, such that there is substantially no relative movement between mask 270 and support device 250.

In one example, the holding device 280 includes a releasable vacuum clamp to hold mask 270 in a relatively stationary manner during movement. In another example, holding device 280 can use other methods to hold mask 270, such as a high friction coating, as known to one of ordinary skill in the art. A high friction coating can also be used to increase the shear force capacity of a vacuum clamp.

Figure 3:
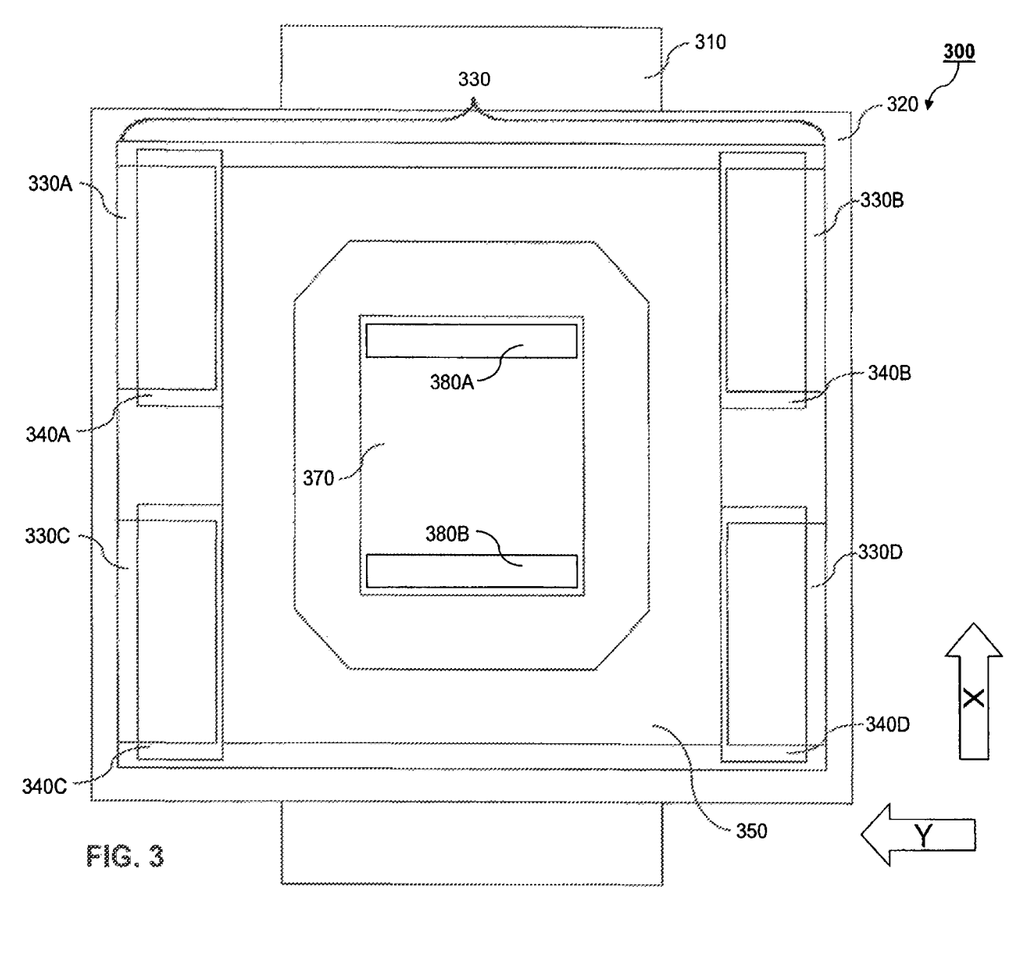
FIG. 3 is an illustration of a top view of a reticle transport system without anti-slip control, according to an embodiment of the present invention.

FIG. 3 is an illustration of a reticle transport system 300, according to an embodiment of the invention.

In this example reticle transport system 300 includes a long stroke device 310, a support frame 320, a transport device 330, coils 330A-330D, magnets 340, a support device 350, patterning device 370, and a holding device 380.

In an example, support device 350 can magnetically levitate relative to support frame 320 by vertically oriented Lorentz type actuators (not shown). There can be no physical contact between support frame 320 and support device 350.

In one example, patterning device 370 (e.g., a mask or a reticle) may be releasably held to support device 350 by holding device 380. In one example, holding device 380 may comprise a pair of vacuum clamps 380A and 380B that hold mask 370 to support device 350 through friction enhanced by a vacuum force. In one example, support device 350 can move in both the x-direction and y-direction. In one example, coils 330A-330D can provide a force in the y-direction to produce a motion of support device 350. Magnets 340A-340D electromagnetically couple coils 330 without physical contact. Pairs of respective items 330-340 comprise Lorentz type electromagnetic actuators as known in the art as pure force couplings.

In one example, long stroke device 310 moves support frame 320 in the x direction (via X-oriented Lorentz actuators not shown) at a relatively slow speed that does not generate any shearing forces between mask 370 and support device 350.

In one example, transport device 330 moves mask 370 in the +y and −y directions accelerating at a relatively high rate to a substantial scanning speed. In one example, transport device 330 comprises a series of magnets and coils that allow for high Y-forces to be exerted by support frame 320 to support device 350. In one example, transport device 330 includes coils 330A-330D and magnets 340A-340D. In one example, the coils 330 are mounted to support frame 320 and magnets 340 are coupled to support device 350.

For example, to move support device 350 with the releasably coupled mask 370, in a −y direction (e.g., left to right in FIG. 3), coils 330A and 330C are energized to produce a repelling force against magnets 340A and 340C. When coils 330A and 330C are energized, the repelling force against magnets 340A and 340C propels support device 350 in the −y direction. To assist movement of support device 350 in the −y direction, coils 330B and 330D are energized, such that they substantially simultaneously produce a pulling force to magnets 340B and 340D. Therefore, coils 330A and 330C and magnets 340A and 340C push support device 350 in the −y direction, while coils 330B and 330D and magnets 340B and 340D substantially simultaneously pull support device 350 in the −y direction.

Similarly, movement of the support device 350 and mask 370 in the +y direction is performed in the same manner, except the forces are reversed. Device coils 330A and 330C and magnets 340A and 340C, when energized, pull support device 350 in the +y direction, while coils 330B and 330D and magnets 340B and 340D substantially simultaneously push support device 350 in the +y direction.

It is to be appreciated that the embodiment shown in FIG. 3 relies on the friction created by holding device 380 (e.g., vacuum clamps and/or friction coating) between mask 370 and support device 350 to prevent slippage of mask 370 during movement.

Figure 4:
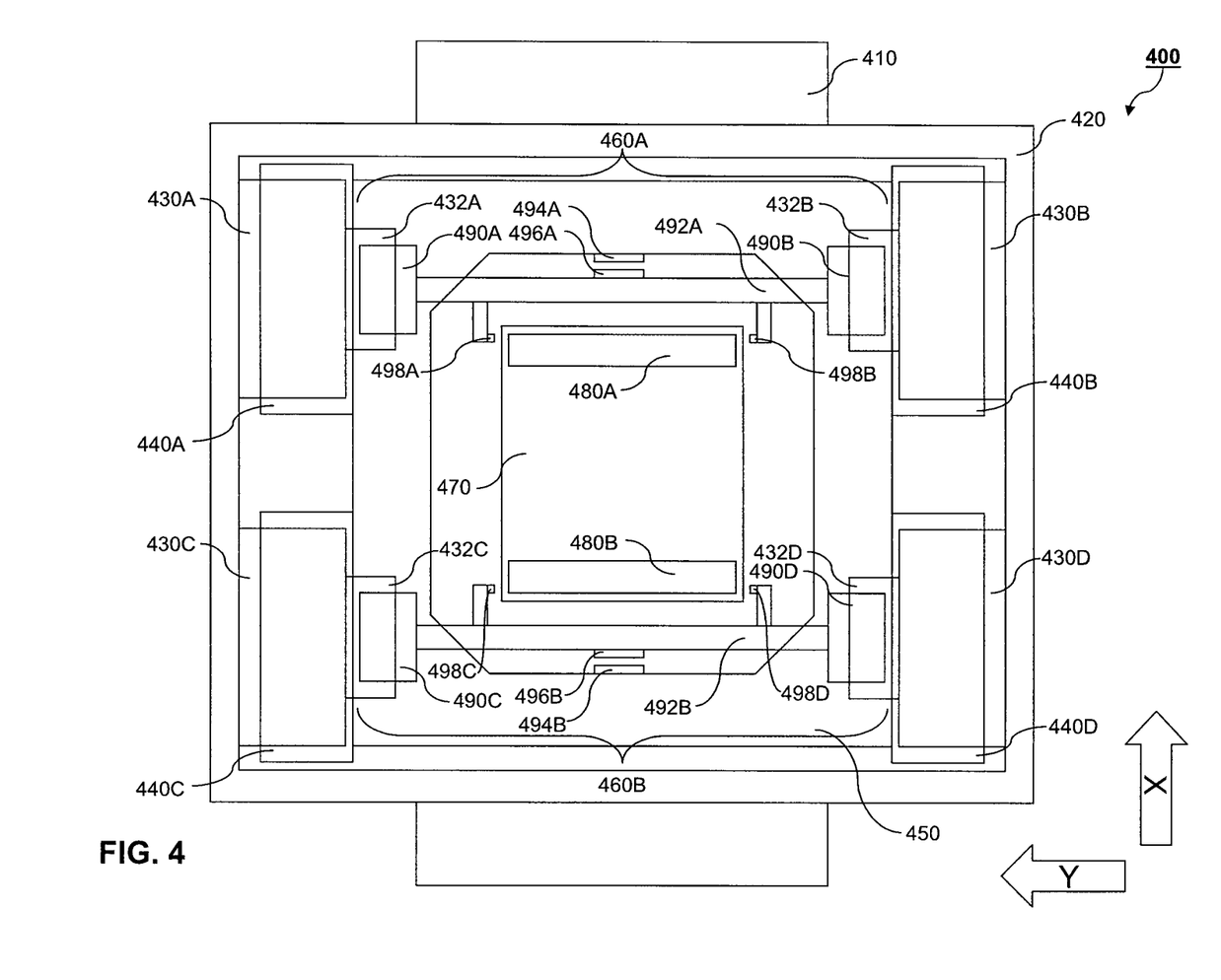
FIG. 4 is an illustration of a top view of a reticle transport system with anti-slip control, according to an embodiment of the present invention.

FIG. 4 is an illustration of a reticle transport system 400 with anti-slip control, according to an embodiment of the invention.

In this example, reticle transport system 400 includes a long stroke device 410, a support frame 420, coils 430, and magnets 440 of a mask force device 460, a support device 450, a mask 470, and a holding device 480.

In one example, reticle transport system 400 works in a similar manner to reticle transport system 300, but with the addition of mask force device 460. Movement in the x direction is accomplished as in FIG. 3 through the use of long stroke device 410, which moves support frame 420 on which support device 450 is mounted.

In one example, movement in the y direction is similar to that described above, where, for example to move in the −y direction, coils 430A and 430C and magnets 440A and 440C are energized to push support device 450 in the −y direction, while device coils 430B and 430D and magnets 440B and 440D are energized to substantially simultaneously pull support device 450 in the −y direction. Movement of the support device 450 and mask 470 in the +y direction is done in the same manner, except that the forces are reversed. Coils 430A and 430C and magnets 440A and 440C are energized to pull support device 450 in the +y direction, while coils 430B and 430D and magnets 440B and 440D are energized to substantially simultaneously push support device 450 in the +y direction.

In an alternative example, mask force device 460 is used in reticle transport system 400 to supplement the frictional force of holding devices 480A and 480B (e.g., vacuum clamps) with an axial push force applied directly to mask 470 at its trailing edge of travel, in order to substantially reduce or eliminate mask (e.g., reticle) slip. Mask force device 460 includes sections 460A and 460B for each side of mask 470, and operates in substantially the same manner. Mask force device 460A includes coil extensions 432A and 432B, magnets 490A and 490B, connecting rod 492A, pushpins 498A and 498B, centering magnet 496A, and centering mark 494A. In this example, mask force device 460B is a mirror image of mask force device 460A and includes coil extensions 432C and 432D, magnets 490C and 490D, connecting rod 492B, pushpins 498C and 498D, centering magnet 496B, and centering mark 494B.

In one example, when coils 430A and 430C are energized to move support device 450 in the −y direction (e.g., left to right in FIG. 4), the signal applied to coil 430A is also applied to coil extension 432A, and similarly the signal applied to coil 430C is also applied to coil extension 432C. In an example, the signal can be different between coil 430A and 432A and 430C and 432C in order to produce a force on mask 470 that is congruous with the desired acceleration direction and value. Similarly, as coils 430A and 430C are energized to produce the repelling force against magnets 440A and 440C to propel support device 450 in the −y direction, coil extensions 432A and 432C are energized and produce a repelling force against magnets 490A and 490C resulting in a force in the −y direction on connecting rods 492A and 492B.

Although only the operation of mask force device 460A is described, a similar operation can occur with respect to mask force device 460B. Concurrently with the energizing of coil 430A and coil extension 432A, coil 430B and coil extension 432B are also energized and produce a pulling force, as previously described with respect to coil 430B and magnet 440B, on connecting rod 492A in the −y direction. As magnets 490A and 490B, connecting rod 492A, and pushpins 498A and 498B begin to move in the −y direction, pushpin 498A will contact mask 470. The contact between pushpin 498A and mask 470 produces a force directly on mask 470 to move mask 470 in the −y direction.

In summary, in this example of the operation, mask 470 moves in the −y direction through energizing coils 430A and 430C, which produces a pushing force against magnets 440A and 440C and connected support device 450 in the −y direction. Substantially simultaneously, coil extensions 432A and 432C are energized and generate a pushing force against magnets 490A and 490C, which in turn push connecting rods 492A and 492B. Also substantially simultaneously, coils 430B and 430D are energized to produce a pulling force to magnets 440B and 440D, and connected support device 450, in the −y direction. Coil extensions 432B and 432D also generate a pulling force to magnets 490B and 490D, which in turn pull connecting rods 492A and 492B. As the connecting rods, and other connected elements, start to move in the −y direction, pushpins 498A and 498C contact mask 470 to move mask in the −y direction. This operation produces force on both mask 470 and support device 450 to move in the −y direction.

As known to one skilled in the art, the division of force between that applied to mask 470 and support device 450 may be varied to produce a desired division. As an example, 50% of the force could be applied to mask 470 and 50% to support device 450.

In one example, moving mask 470 in the +y direction is accomplish in the same manner as described above, except in a reverse direction. Energizing coils 430A and 430C produces a pulling force on magnets 440A and 440C, and connected support device 450, in the +y direction. Substantially simultaneously, coil extensions 432A and 432C are energized to generate a pulling force on magnets 490A and 490C, which pull connecting rods 492A and 492B. Also substantially simultaneously, coils 430B and 430D are energized producing a pushing force against magnets 440B and 440D, and connected support device 450, in the +y direction. Coil extensions 432B and 432D generate a pushing force against magnets 490B and 490D, which pushes connecting rods 492A and 492B. As the connecting rods, and other connected elements, start to move in the +y direction, pushpins 498B and 498D contact mask 470 to move mask 470 in the +y direction. This operation produces force on both mask 470 and support device 450 to move in the +y direction.

In an embodiment, after a movement of mask 470 in either the +y or −y direction, centering magnets 496A and 496B align with centering marks 494A and 494B. The alignment centers mask 470 in relationship to mask force devices 460A and 460B.

Figure 5:
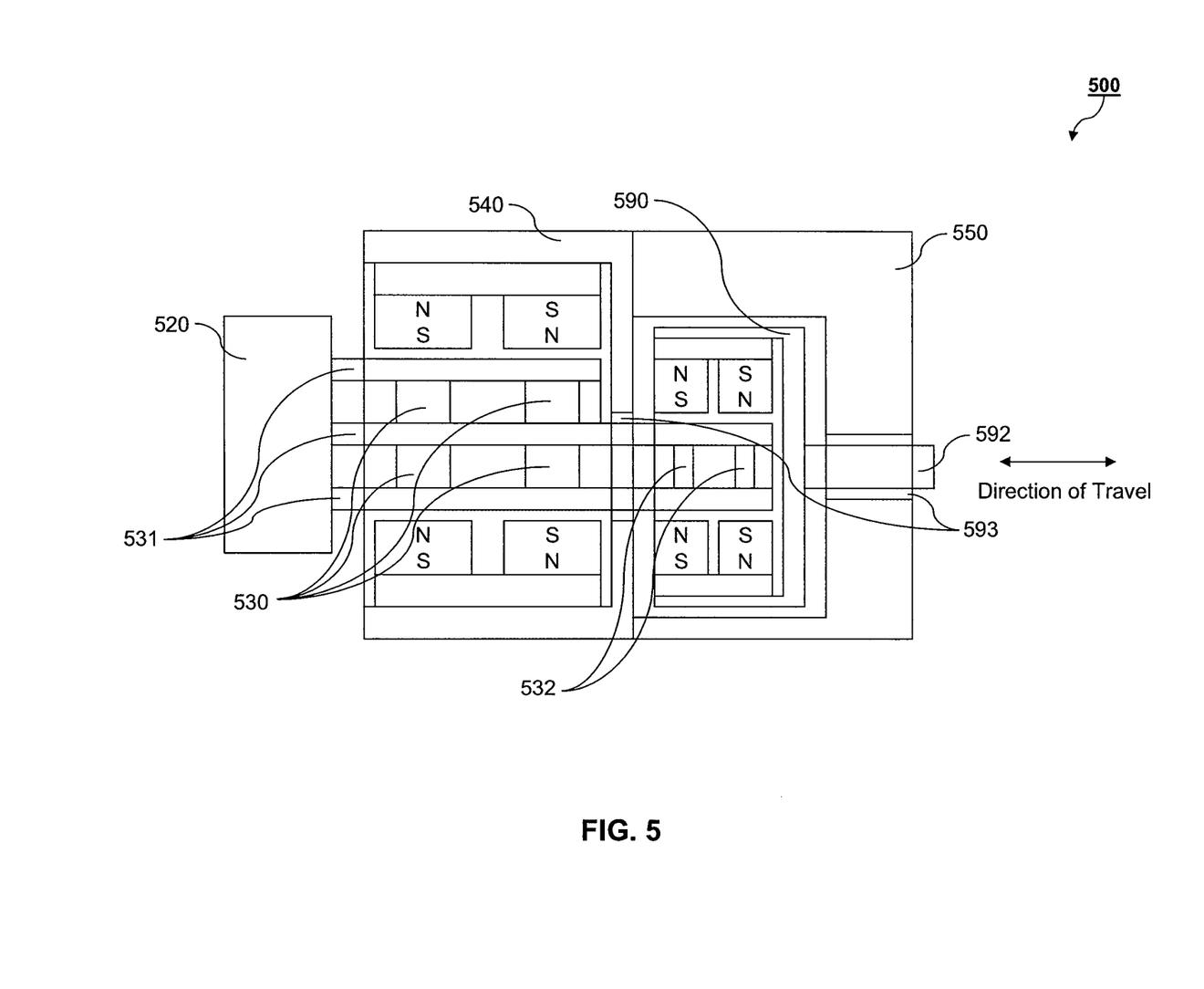
FIG. 5 is an illustration of a partial side view of a reticle transport system with anti-slip control, according to an embodiment of the present invention.

FIG. 5 is a cross sectional illustration of a reticle transport system 500, according to an embodiment of the invention.

In this example, reticle transport system 500 includes support frame 520, coil 530, mask control system cooling system 531, coil extension 532, magnet 540, support device 550, magnet 590, connecting rod 592, and air bearing 593.

In an example, connecting rod 592 is supported by air bearing 593 within support device 550. Connecting rod 592 is connected to magnet 590. Connecting rod 592 and magnet 590 are separated from coil extension 532, but interact through magnetic forces.

In an example, mask control system cooling system 531 provides cooling to coils 530 and coil extension 532 and the surrounding areas using a variety of methods as known to one of ordinary skill in the art.

Figure 6:
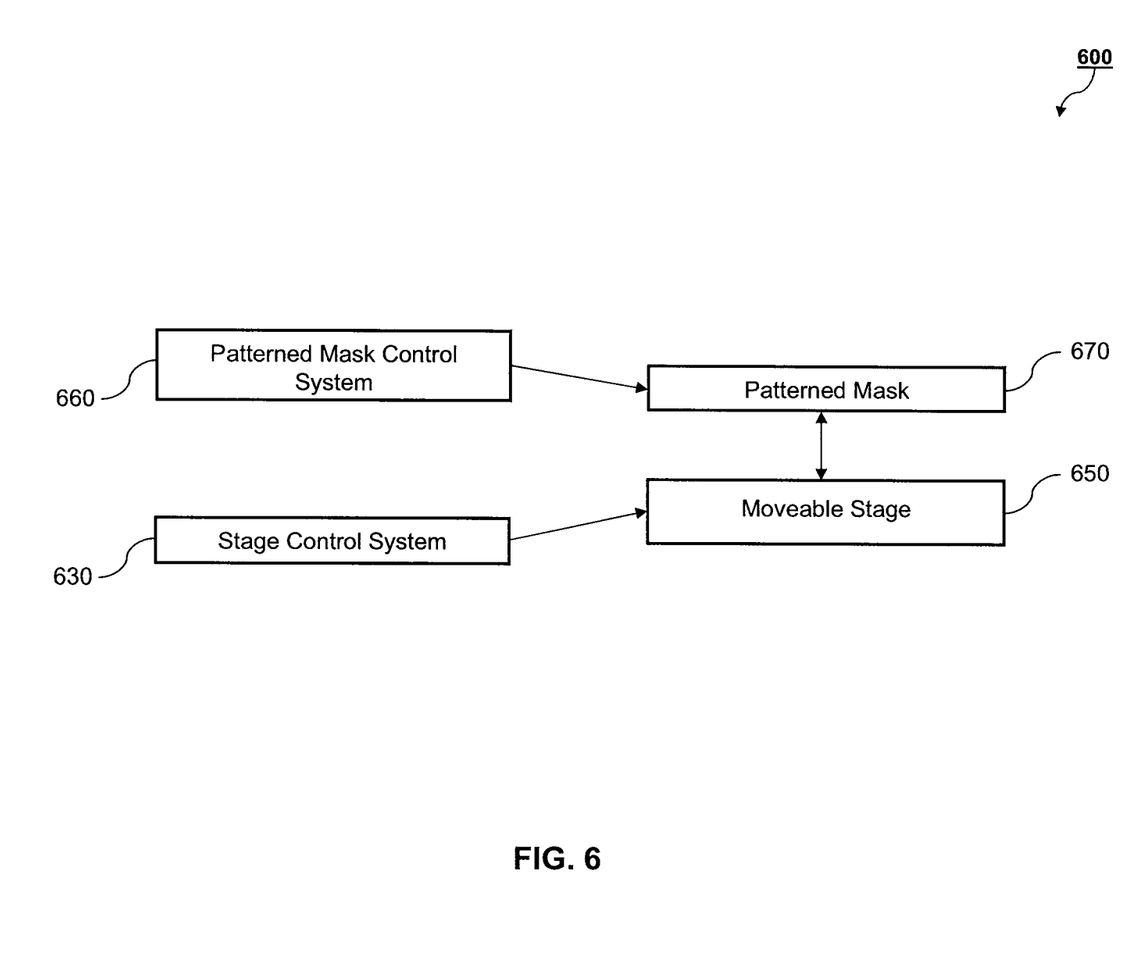
FIG. 6 is an illustration of a stage system with anti-slip control, according to an embodiment of the present invention.

FIG. 6 is an illustration of a stage system 600 for a lithographic apparatus, according to an embodiment of the invention.

In this example, stage system 600 includes stage control system 630, a stage 650, a mask control system 660, and a mask 670.

In one example, mask 670 is releasably held to stage 650 (e.g., using a vacuum). Stage control system 630 is coupled to stage 650. Stage control system 630 may provide sufficient force to allow movement of stage 650. Stage control system 630 may move stage 650, and the releasably held mask 670, at a high rate of speed with a corresponding high rate of acceleration. Such acceleration can generate a shearing force between mask 670 and stage 650, such that mask 670 can slip relative to stage 650. To substantially eliminate the shearing force, mask control system 660 is releasably coupled to mask 670. Mask control system 660 may provide a sufficient force directly to mask 670 to allow movement of mask 670, thereby reducing the shearing force between mask 670 and stage 650. The force between mask 670 and stage 650 is such that, given the coupling of mask control system 660 to mask 670, there is sufficient holding force such that there is substantially no relative movement between mask 670 and stage 650.

In another embodiment stage 650 can use other methods to hold mask 670, such as a friction coating or other methods as known to one of ordinary skill in the art.

Figure 7:
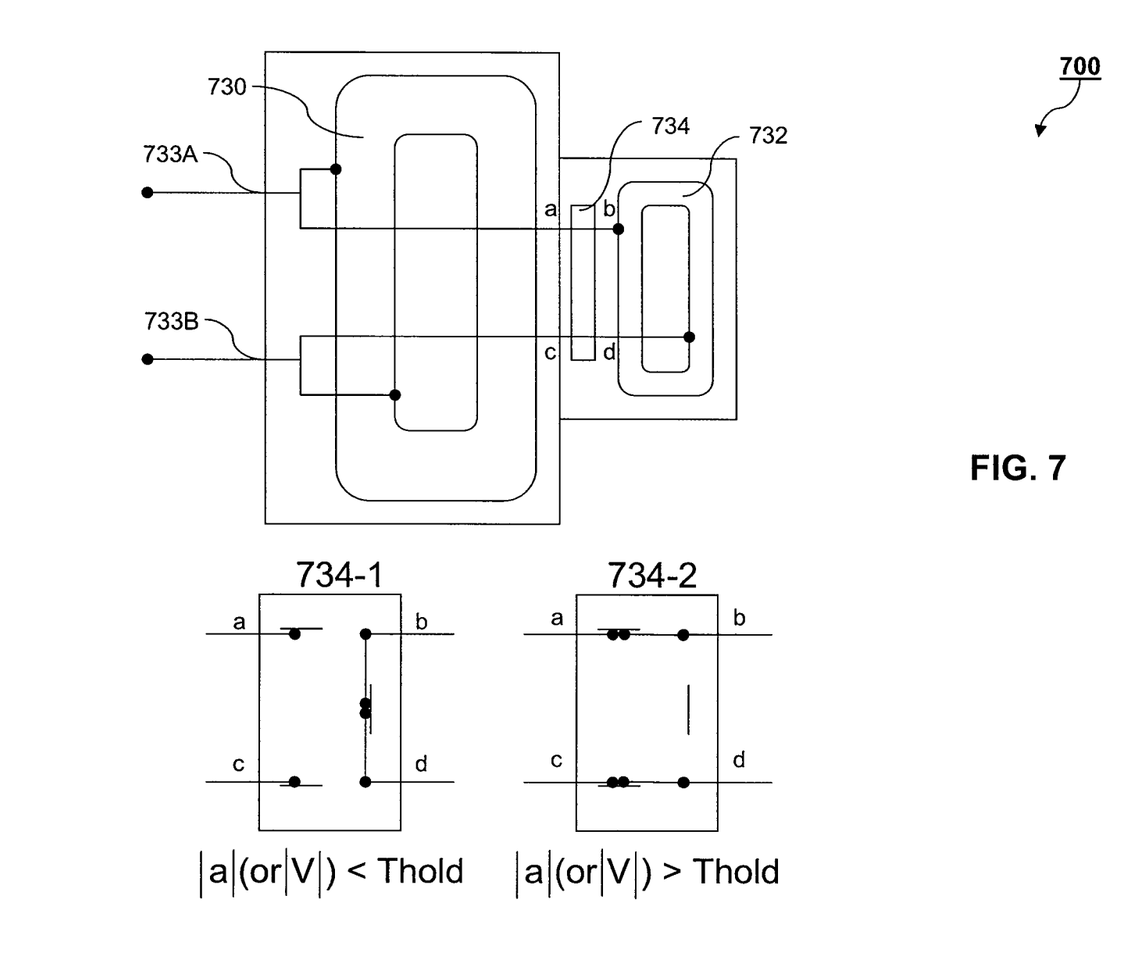
FIG. 7 is an illustration of a parallel eddy current damping control system according to an embodiment of the present invention.

FIG. 7 is an illustration of a parallel eddy current damping system 700, according to an embodiment of the invention.

In this example, parallel eddy current damping system 700 includes coil 730, coil extension 732, and eddy current damping switch 734.

In one example, parallel eddy current damping system 700 is used in conjunction with another system, such as stage system 600. In another example, parallel eddy current damping system 700 is used in conjunction with another system, such as reticle transport system 400. Eddy current damping system 700 can be configured to minimize oscillation, which can be achieved through the use of an inertially-driven switch or transistor switch, or any other device as would be known by one of ordinary skill in the art.

In an example, when an absolute value of acceleration or velocity of a mask (not shown) is exceeded, eddy current damping switch 734, in a state shown in 734-2, allows coil 730 and coil extension 732 to connect through wires 733A and 733B to a power source (not shown). In another example, when the absolute value of acceleration or velocity is below a threshold value, (e.g., acceleration is near zero), then eddy current damping switch 734 is in a state shown in 734-1, thus shorting out coil 730 and coil extension 732, eliminating any eddy current.

Figure 8:
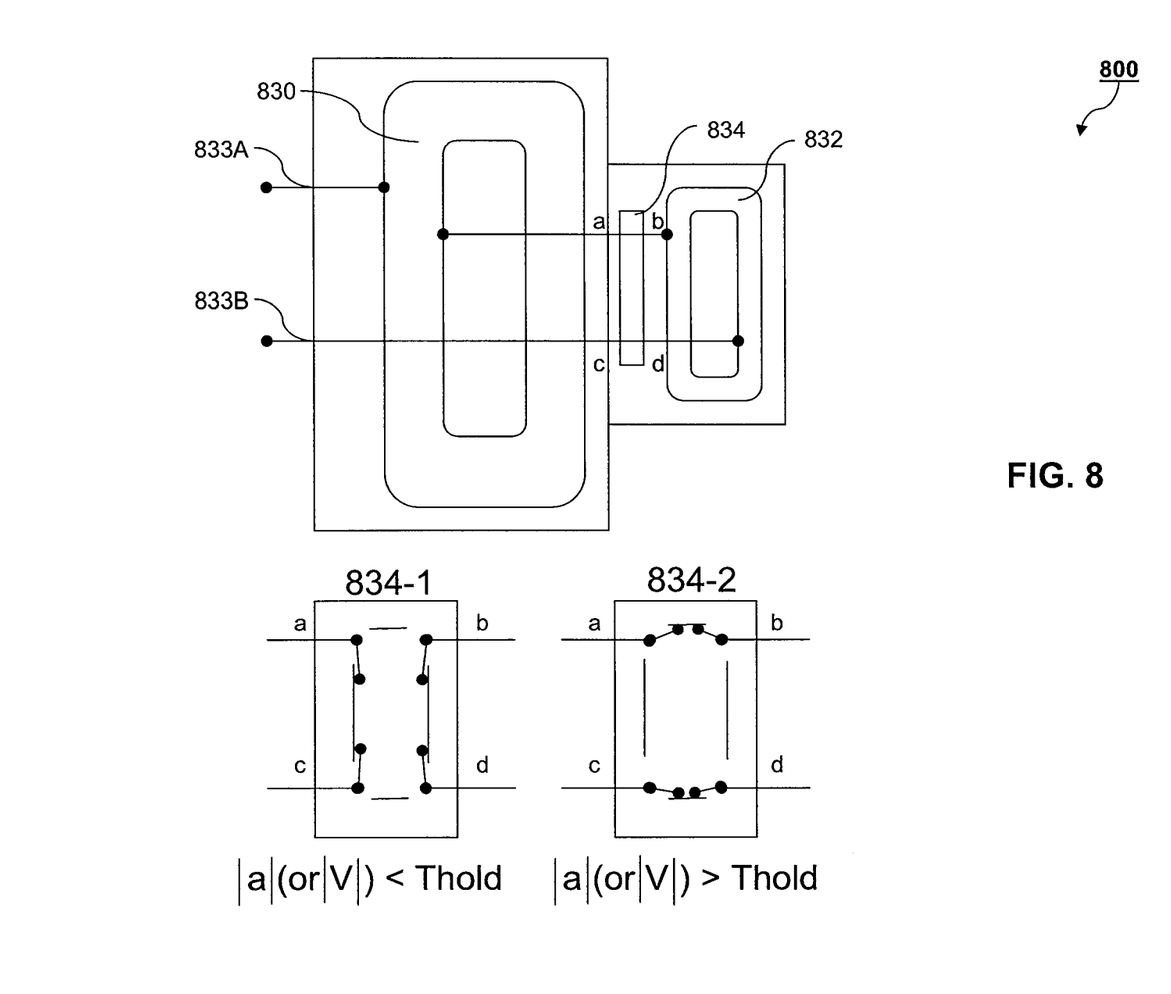
FIG. 8 is an illustration of a series eddy current damping control system, according to an embodiment of the present invention.

FIG. 8 is an illustration of a series eddy current damping system 800, according to an embodiment of the invention.

In this example, series eddy current damping system 800 includes a coil 830, a coil extension 832, and an eddy current damping switch 834.

In one example, parallel eddy current damping system 800 is used in conjunction with another system, such as stage system 600. In another embodiment, parallel eddy current damping system 800 is used in conjunction with another system, such as reticle transport system 400. In one example, eddy current damping system 800 can minimize oscillation through the use of an inertially-driven switch or transistor switch, or other devices as would be known by one of ordinary skill in the art.

In an example, when an absolute value of acceleration or velocity of a mask (not shown) is exceeded, eddy current damping switch 834, in a state as shown in 834-2, allows coil 830 and coil extension 832 to connect using wires 833A and 833B to a power source (not shown). In another example, when the absolute value of acceleration or velocity is below a threshold value, (e.g., acceleration is near zero), then eddy current damping switch 834 is in a state as shown in 834-1, thus shorting out coil extension 832, eliminating any eddy current.

Figure 9:
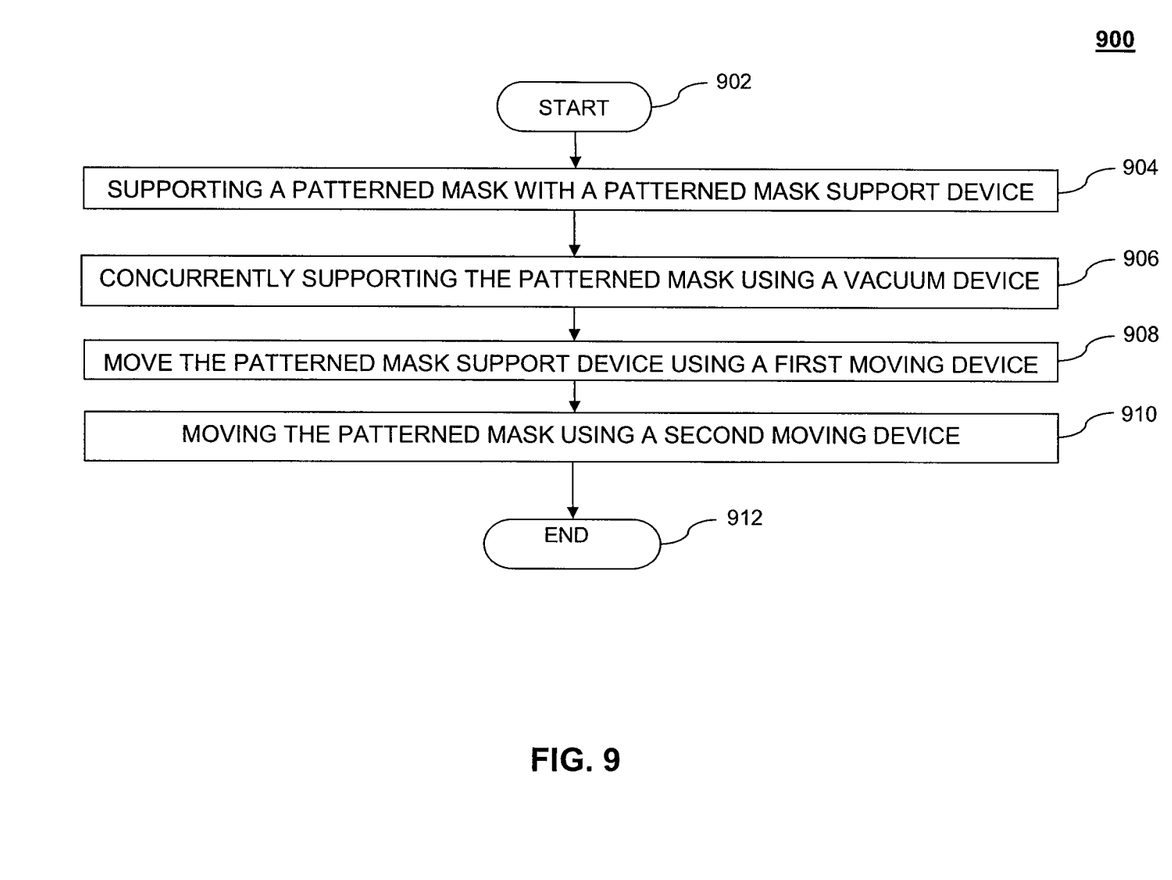
FIG. 9 is a flowchart illustrating a method for reticle transport with anti-slip control, according to an embodiment of the present invention.

FIG. 9 is an illustration of a flowchart depicting a method 900 for moving a mask, according to an embodiment of the present invention. For example, method 900 may be preformed using one or more of the above devices depicted in FIGS. 1A, 1B, and 2-8.

In this example, method 900 starts at step 902, and proceeds to step 904. In step 904, a patterned mask is supported with a support device. In step 906, the mask is concurrently support using a vacuum device. In step 908, the support device is moved using a first moving device. In step 910, the mask is moved using a second moving device. The method then ends at step 912.

Conclusion

It is to be appreciated that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A reticle transport system comprising:
a support frame;
a support device;
a holding system configured to hold a mask against the support device, the holding system comprising:
a holding device configured to remain stationary with respect to the support device, and
a mask force device configured to be moveable, wherein:
the holding device is configured to releasably couple the mask to the support device, and
the mask force device is configured to apply an axial push force to the mask to secure the holding device against the mask; and
a support transport device comprising coils and magnets and configured to move the support device, wherein:
the coils are coupled to the support frame and the magnets are coupled to the support device; and
the support transport device is coupled to the support device and the support device concurrently moves with the mask force device such that reticle slip during movement of a reticle stage is substantially eliminated.

2. The reticle transport system of claim 1, further comprising:
a vacuum system configured to releasably couple the mask to the holding device.

3. The reticle transport system of claim 1, wherein the mask force device comprises an electro-magnet.

4. The reticle transport system of claim 1, wherein a common control signal controls the mask force device and the support transport device.

5. The reticle transport system of claim 1, wherein the mask force device is configured to provide sufficient force to the mask such that shearing force between the mask and the support device is substantially eliminated.

6. The reticle transport system of claim 1, wherein the mask force device further comprises a connecting rod and a push-pin.

7. The reticle transport system of claim 1, further comprising:
an alignment system configured to center the mask force device relative to the mask, comprising:
a centering magnet; and
a centering mark.

8. The reticle transport system of claim 1, wherein:
the support frame is configured to move with the reticle stage; and
the support device is mounted on the support frame such that in use the mask force device reacts against the support frame which is moving in the operational use.

9. The reticle transport system of claim 1, wherein other coils are provided as extensions of the coils of the support transport device for the mask force device.

10. The reticle transport system of claim 1, wherein:
the holding device is configured to apply a frictional force to the mask; and
the mask force device is configured to supplement the frictional force of the holding device by directly applying in a longitudinal axis of the mask the push force at an edge of the mask such that the push force acts in a direction of travel of the mask in the operational use.

11. The reticle transport system of claim 1, wherein the axial push force is a predetermined value.

12. The reticle transport system of claim 1, wherein:
the support transport device is configured to generate a force to move the support device; and
the mask force device is configured to generate the axial push force substantially simultaneously with the force.

13. The reticle transport system of claim 1, further comprising air bearings configured to guide the mask force device.

14. The reticle transport system of claim 1, further comprising an eddy current dampening system configured to substantially reduce flow of an electric current between a first electro-magnet of the mask force device and a second electro-magnet of the support transport device.

15. The reticle transport system of claim 1, further comprising a first cooling system configured to cool the mask force device.

16. The reticle transport system of claim 1, further comprising a second cooling system configured to cool the support transport device.

17. A method for reducing reticle slip during movement of a reticle stage, the method comprising:
supporting a pattern mask with a support device;
moving the support device using a first moving device, the first moving device comprising coils and magnets, the coils being coupled to a support frame and the magnets being coupled to the support device;
holding the pattern mask against the support device using a second moving device and a holding device that remains stationary with respect to the support device; and
applying an axial push force to the pattern mask using the second moving device to secure the holding device against the pattern mask, wherein the second moving device is releasably coupled to the pattern mask.

18. The method of claim 17, further comprising:
controlling the first moving device and the second moving device with a common signal.

19. The method of claim 17, wherein:
the first moving device is coupled to the support device; and
the first moving device moves the support device concurrently with the second moving device such that the reticle slip during the movement of the reticle stage is substantially eliminated.

* * * * *